United States Patent [19]
Adachi et al.

[11] Patent Number: 5,408,105
[45] Date of Patent: Apr. 18, 1995

[54] OPTOELECTRONIC SEMICONDUCTOR DEVICE WITH MESA

[75] Inventors: Hideo Adachi, Minoo; Kenichi Matsuda, Morigochi, both of Japan

[73] Assignee: Matsushita Electric Industrial Co., Ltd., Osaka, Japan

[21] Appl. No.: 19,223

[22] Filed: Feb. 18, 1993

[30] Foreign Application Priority Data

Feb. 19, 1992 [JP] Japan .................................. 4-031670
Mar. 2, 1992 [JP] Japan .................................. 4-044409

[51] Int. Cl.⁶ .......................................... H01L 33/00
[52] U.S. Cl. .......................................... 257/13; 257/95; 257/96; 257/97; 257/98; 372/45; 372/46; 372/48; 372/50
[58] Field of Search .................... 257/13, 17, 22, 94, 257/95, 96, 97, 98; 372/50, 48, 46, 45

[56] References Cited

U.S. PATENT DOCUMENTS

| 4,943,970 | 7/1990 | Bradley | 257/22 X |
| 4,991,179 | 2/1991 | Deppe et al. | 372/45 |
| 5,052,008 | 9/1991 | Kemeny | 372/46 X |
| 5,181,085 | 1/1993 | Moon et al. | 257/96 X |
| 5,206,871 | 4/1993 | Deppe et al. | 372/45 |
| 5,283,447 | 2/1994 | Olbright et al. | 372/48 X |

Primary Examiner—William Mintel
Attorney, Agent, or Firm—Rogers & Wells

[57] ABSTRACT

There are disclosed a low driving voltage surface emitting semiconductor laser and an optoelectronic integrated which comprises a two-dimensional array of such surface emitting semiconductor lasers which are modulatable with input signals of small voltage amplitudes. In an embodiment of the present invention, an optical semiconductor device includes a GaAs substrate 105, and an epitaxial growth layer structure on the GaAs substrate, the epitaxial growth layer structure including in the named order a p type GaAs/AlAs multilayer semiconductor mirror layer 104, an active layer 103 and an n type GaAs/AlAs multilayer semiconductor mirror layer 102. The epitaxial growth layer structure is etched to the depth of the active layer in forming a mesa, while the p type mirror layer remains unetched throughout a top surface of the semiconductor substrate.

12 Claims, 4 Drawing Sheets

GaAs Layer    AlAs Layer

OPTOELECTRONIC SEMICONDUCTOR DEVICE WITH MESA

INDUSTRIAL UTILITY

This invention generally relates to an optoelectronic semiconductor device and particularly to a surface emitting semiconductor laser having the function of radiating laser light in a direction traversing a substrate of the laser and the capability of optical parallel information processing through the use of high integration of a number of such semiconductor lasers.

The invention further relates to an optoelectronic integrated circuit device containing a two-dimensional array of selectively drivable surface emitting semiconductor lasers and further relates to an optoelectronic integrated circuit device containing semiconductor lasers with ease of optical coupling with a light transmission path comprising, for instance, optical fibers.

DESCRIPTION OF PRIOR ART

Intensive and comprehensive efforts have recently been focused on research and development of surface emitting semiconductor lasers including laser resonance mirrors of multi-layered semiconductor structures which are made through utilizing high precision thickness control technique such as molecular-beam gas growth technique or the like. More particularly, multi-layered mirror structures which are made of GaAs/AlAs as material are in wide use because of a greater refractive index and thus a higher reflection factor. This sort of conventional surface emitting semiconductor lasers is of a typical structure as illustrated in "Electronics Letters," Vol. 25, Page 1123, August 1989.

Figures 6A, 6B:
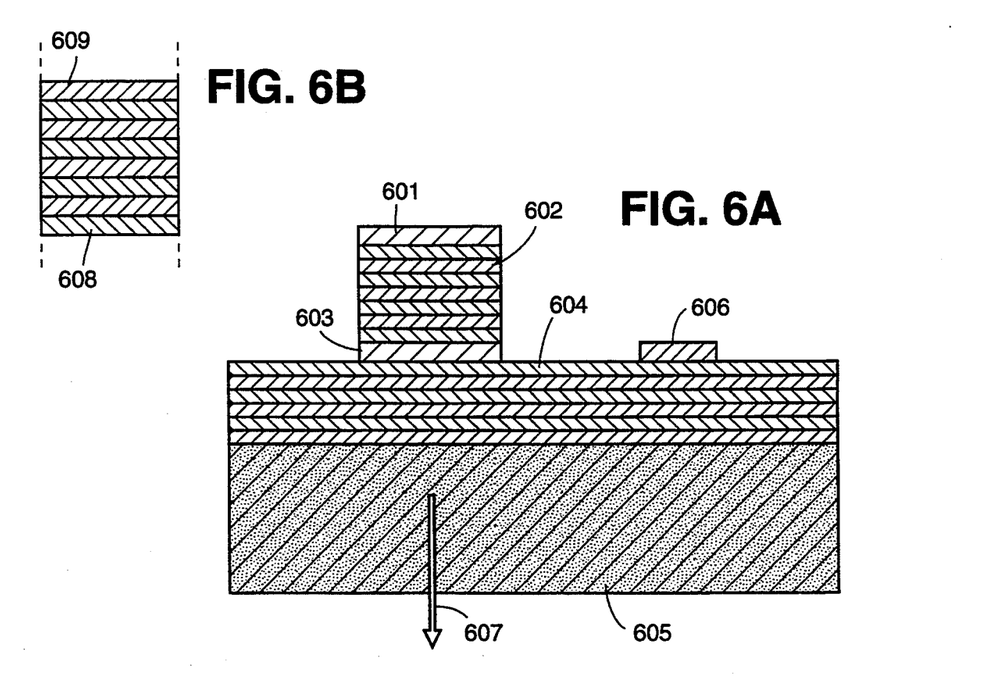
FIG. 6(a) is a cross sectional view of a conventional surface emitting semiconductor laser.
FIG. 6(b) is an enlarged view of a p type mirror layer structure in the conventional semiconductor laser of FIG. 6(a)

A typical example of the conventional optical semiconductor device is discussed hereinafter, referring to FIG. 6 which is a cross sectional view of a conventional semiconductor device and an enlarged view of a p type mirror layer. As depicted in FIG. 6, the conventional semiconductor device comprises an electrode 601, a p type mirror layer 602 of multi-layered semiconductor structure of GaAs/AlAs, an active layer 603, an n type mirror layer 604 of multi-layered semiconductor structure of GaAs/AlAs, a GaAs substrate 605, an electrode 606, laser light 607, a p type $\lambda/4$ GaAs layer 608 and a p type $\lambda/4$ AlAs.

With the optical semiconductor device of the above mentioned structure, carriers are injected into the active layer 603 via the mirror layer upon application of a bias voltage between the two electrodes. As a consequence, the active layer 603 emits light which in turn is oscillated within a resonator composed of the p type mirror layer 602 and the n type mirror layer 604 to generate and radiate coherent light outwardly. The foregoing is an overview of the operation of the surface emitting semiconductor laser.

Figure 7:
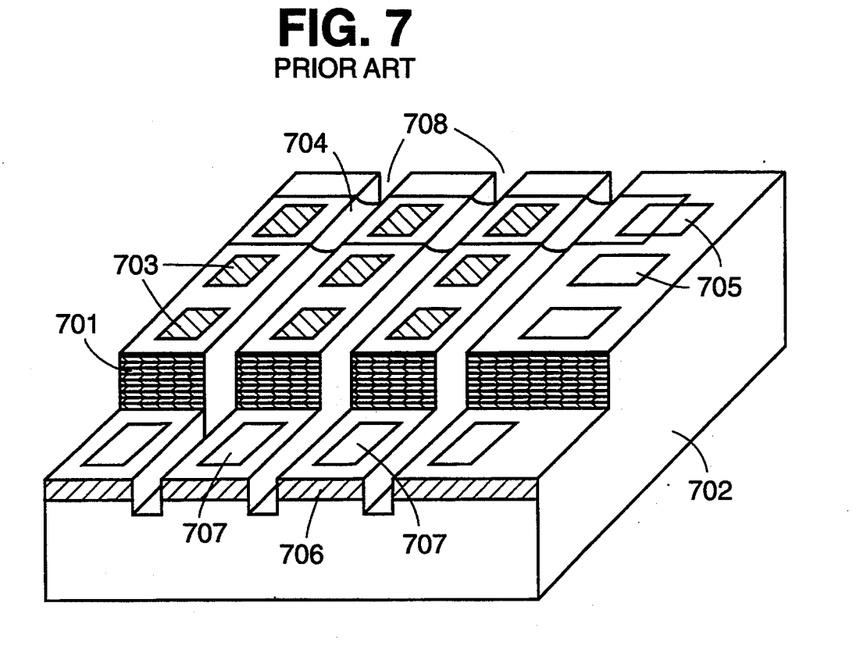
FIG. 7 is a perspective view of a conventional optoelectronic integrated circuit device.

An optoelectronic integrated circuit device wherein surface emitting semiconductor lasers arranged in a two-dimensional array are selectively drivable, for instance, is illustrated in "Matrix Addressable Surface Emitting Laser Array," 1990 Technical Digest of Conference on Lasers and Electro-Optics, CTUF3, by M. Orenstein et al. This optoelectronic integrated circuit device is shown in FIG. 7. Surface emitting semiconductor lasers 701 of the vertical resonance type are arranged in a two-dimensional array on a semi-insulating semiconductor substrate 702, with anode electrodes 703 of the surface emitting semiconductor lasers 701 adjacent to each other in a row direction to be connected together to row wirings 704. Disposed at one end of each of the row wirings 704 are row pads 705 to be connected to an external circuit. Cathodes of the surface emitting semiconductor lasers 701 adjacent to each other in a column direction, on the other hand, are connected to common n+ wiring layers 706 of which one end is each connected to a column pad 707.

The above arrangement makes it possible to selectively drive the surface emitting semiconductor lasers in the two-dimensional array. When a bias voltage is applied between a selected one of the row pads 705 and a selected one of the column pads 707, the only surface emitting semiconductor laser at the crossing of the two selected ones of the pads is enabled. In addition, when a clock signal is applied in sequence to the column wirings and a bias voltage is applied to the row wirings in synchronization with the clock signal, a desired pattern of lighting may be produced in a time-sharing manner.

On the other hand, a variety of mounting techniques have been proposed to optically couple semiconductor lasers or optoelectronic integrated circuit devices, including semiconductor lasers, with optical fiber. In order to secure high efficiency of coupling between the semiconductor lasers and the optical fiber, it is required to insert a lens between the two components and keep the positional relationship among the semiconductor lasers, the lens and the optical fiber under precise control.

One conventional way to mount the optical fiber on the semiconductor lasers or the optical integrated circuit devices is to achieve positioning of the optical fiber with the aid of a manipulator while the semiconductor lasers are enabled and the power of light from a remote end of the optical fiber is monitored, in such a manner as to fix the optical fiber at the location where the maximum power of light is assured. This positioning technique, however, was time consuming and might cause misalignment at the final step of fixing. As an alternative way, an attempt was made in positioning the optical fiber in dependence upon the mechanical accuracy of the packages, in which case precise fixture of the semiconductor lasers, the lens and the optical fiber in regard to the packages thereof is mandatory. There is, however, a problem with this alternative way that it might be more expensive than the manipulator-assisted positioning technique.

PROBLEMS TO BE SOLVED BY THE INVENTION

Figure 8:
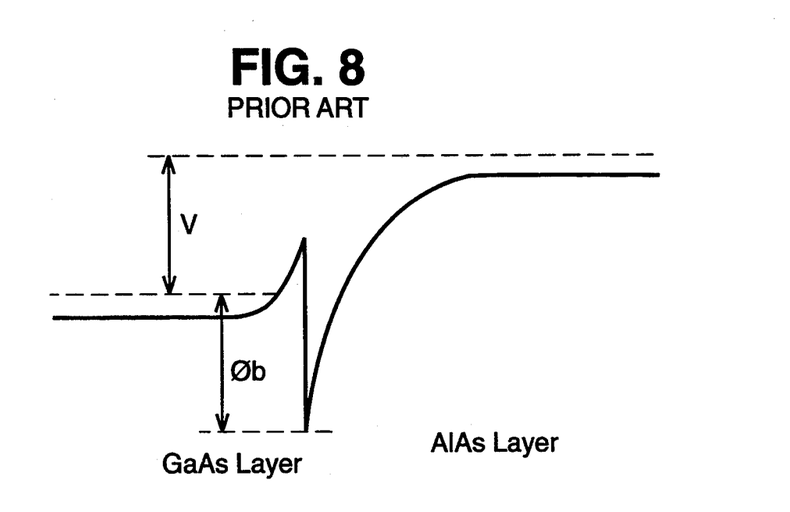
FIG. 8 is a band diagram of a valence band of a p type GaAs/AlAs junction interface.

A first problem to be solved by the present invention is that a spike at a valence band developed at an interface at a GaAs/AlAs heterojunction in a p type mirror layer of a surface emitting semiconductor laser would limit electric conduction of holes and a very high voltage should be applied to enable the surface emitting semiconductor laser. FIG. 8 depicts an energy band diagram of a valence band at a GaAs/AlAs heterojunction interface. The energy band is shown when a positive voltage V is applied the GaAs side, where the spike as designated by $h_b$ prevents electric conduction of holes. This entails the need for a very high enabling voltage and causes a problem with heat generated.

A first and primary object of the present invention is to provide a surface emitting semiconductor laser which may be enabled with a low voltage.

A second problem to be solved by the present invention is that a surface emitting semiconductor laser of a vertical resonance type assumes a high series resistance and needs a high enabling voltage. Therefore, if it is desired to modulate light emitted from a selected one of surface emitting semiconductor lasers in an optoelectronic integrated circuit device including a two-dimensional array of selectively drivable surface emitting semiconductor lasers, then electric signals with a large voltage amplitude are required.

Accordingly, a second object of the present invention is to provide an optoelectronic integrated circuit device including surface emitting semiconductor lasers arranged in a two-dimensional array to be selectively modulatable with input signals of a low voltage amplitude.

A third problem to be solved by the present invention is that a conventional mounting technique is time consuming and subject to possible misalignment for placing optical fiber into optical coupling relationship with a semiconductor laser or optoelectronic integrated circuit device including a plurality of semiconductor lasers. Another conventional positioning technique relying upon mechanical accuracy is rather costly.

A third object of the present invention is to provide an optoelectronic integrated circuit device including semiconductor lasers easily optically coupleable with a light transmission path such as optical fiber.

MEANS FOR SOLVING THE PROBLEMS

To solve the first problem, the present invention provide a surface emitting semiconductor laser including a GaAs substrate and an epitaxial Growth structure comprising a p type GaAs/AlAs mirror layer disposed on the GaAs substrate, an active layer disposed on the p type mirror layer and an n type GaAs/AlAs mirror layer disposed on the active layer, wherein the epitaxial growth structure is shaped into a mesa by etching away or any other technique of removing partially the n type mirror layer and the active layer while keeping the p type mirror layer unetched to maintain the same on the substrate. To sum up, the present invention solves the first problem by providing the surface emitting semiconductor laser by disposing the p type mirror layer on the GaAs substrate and etching partially the n type mirror layer and the active layer.

To solve the second problem, the present invention provides an optoelectronic integrated circuit device which comprises a semiconductor substrate of a certain conductivity, a cell array of a two-dimensional array of unit cells on the semiconductor substrate, each of the unit cells comprising a surface emitting semiconductor laser and a heterojunction bipolar transistor, the surface emitting semiconductor laser having an anode connected to the semiconductor substrate and a cathode connected to a collector of the heterojunction bipolar transistor, row wirings to which emitters of the heterojunction bipolar transistors adjacent to each other in a row direction are connected commonly, and column wirings to which bases of the heterojunction bipolar transistors adjacent to each other in a column direction are connected commonly.

To solve the third problem, the present invention provides an optoelectronic integrated circuit device which comprises a semiconductor substrate, a cell array of a two-dimensional array of unit cells on the semiconductor substrate, each of the unit cells comprising a surface emitting semiconductor laser and a light receiving element responsive to incident light from outside, a light transmission path having one end facing toward said cell arrays, and matrix wirings for making the position of the light receiving element identifiable within the cell array which receives address light applied from a remote end of said light transmission path, thereby permitting selectively driving of the surface emitting semiconductor lasers within the cell array.

OPERATION OF THE INVENTION

As discussed briefly above, the optical semiconductor device constructed according to the present invention includes the p type mirror layer on the substrate side and only the n type mirror layer and the active layer are partially removed by etching or otherwise. With this arrangement, a current path in the p type mirror layer becomes enlarged to lessen the adverse effect of a spike at the valence band developed at the GaAs/AlAs heterojunction interface and achieve implementations of a low voltage drivable surface emitting semiconductor laser.

In addition, an optoelectronic integrated circuit device implemented according to another key feature of the present invention comprises a two-dimensional array of unit cells on a semiconductor substrate, each of the unit cells comprising a surface emitting semiconductor laser and a heterojunction bipolar transistor driving the surface emitting semiconductor laser. A cathode of the surface emitting semiconductor laser in each of the unit cell is connected to a collector of the heterojunction bipolar transistor in the same unit cell. Emitters of the heterojunction bipolar transistors adjacent to each other in a row direction in the cell array are connected commonly to a respective one of row wirings, whereas bases of the heterojunction bipolar transistors adjacent to each other in a column direction are connected commonly to a respective one of column wirings. The semiconductor substrate assumes a certain conductivity, with the anodes of the surface emitting semiconductor lasers being connected to and grounded via the electrically conductive semiconductor substrate. With the above mentioned arrangement, when a negative bias voltage $-V_{ee}$ is applied to a selected one of the row wirings and a voltage V ($-V_{ee} < V < 0$) to a selected one of the column wirings, only the surface emitting semiconductor laser at its crossing is enabled to emit light. If the voltage V is modulated, then driving current flowing through the surface emitting semiconductor laser is thus modulated to produce an output light modulated accordingly. A sufficient modulation of the output light may be expected even with a small voltage amplitude, because the input signal is amplified through the heterojunction bipolar transistors.

A third key feature of the present invention lies in that unit cells, each comprising a surface emitting semiconductor laser and a light receiving element sensing incident light applied from outside, are arranged in a two-dimensional array on a semiconductor substrate and light transmission paths of optical fiber or the like are optically coupled to the two-dimensional cell array. While the conventional method of optically coupling the semiconductor lasers and the optical transmission paths includes the steps of positioning the two components and then fixing the two components, the present invention utilizes the array of the surface emitting semiconductor lasers to permit the light emission of the surface emitting semiconductor lasers whose optical axes are in agreement with those of the optical transmission paths. One end surface of the optical transmission paths is fixed to face the cell array and the positioning of the optical transmission paths at this moment is carried out by meeting only the condition that output light impinges on anywhere in the cell array. Address light applied via remote ends of the optical transmission paths is then sensed by the light receiving elements to identify the unit cell on which the address light is incident. Where more than one light receiving element senses the address light, the unit cell is selected where the maximum of light receiving power is sensed. Eventually, if the surface emitting semiconductor laser within that unit cell is selectively enabled, then output light is introduced into the associated optical transmission path.

A more specific structure is a cell array including unit cells each of which comprises a combination of the heterojunction bipolar transistor and the surface emitting semiconductor laser. It is noted that each of the light receiving elements consists of a base-to-emitter junction of the heterojunction bipolar transistor. In order that the base-to-emitter junction may be used as the light receiving element, a positive voltage should be applied to the like wirings and the column wirings should be held at a ground potential. When there is incident light whose wavelength is shorter than the absorption edge of the base, light current flows through the column wirings. In other words, if the positive voltage is applied in sequence to the row wirings and current through the respective column wirings is monitored, then the unit cell on which the address light is incident is made identifiable. The method of selectively driving the unit cells on which the address light impinge is similar to that described as the second key feature of the present invention.

The above discussed key features of the present invention are closely related to and dependent upon each other.

Additional features of the present invention are described in relation to the description of the preferred embodiments of the present invention.

DESCRIPTION OF THE PREFERRED EMBODIMENTS

Figure 1:
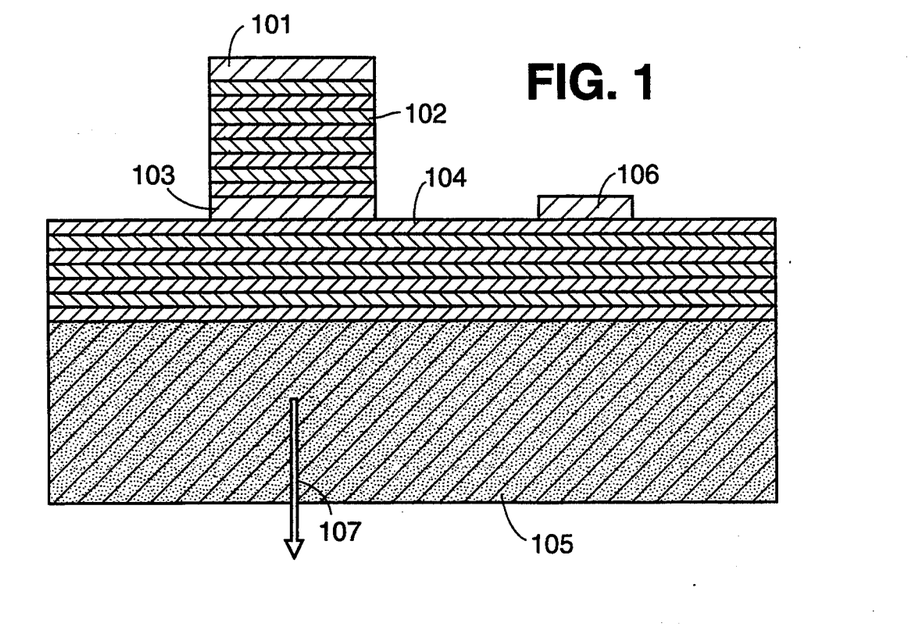
FIG. 1 is a cross sectional structure view of a surface emitting semiconductor laser according to a first embodiment of the present invention.

Referring to the accompanying drawings, a first embodiment of the present invention will be discussed in detail. FIG. 1 is a cross sectional structure view of an optical semiconductor device according to a first embodiment of the present invention. In FIG. 1, there is illustrated the optical semiconductor device which comprises an electrode 101, an n type GaAs/AlAs mirror layer 102, an active layer 103, a p type GaAs/AlAs mirror layer 104, a GaAs substrate 105, and an electrode 106. Laser light emitted from the device is denoted as 107.

Unlike the above described laser structure embodying the present invention, a conventional GaAs/AlAs surface emitting semiconductor laser of the vertical resonance type, (i.e., one comprising an epitaxial growth layered structure of a p type mirror layer, an n type mirror layer and an active layer) uses an n type substrate so that the p type mirror layer is disposed above and on the active layer. Therefore, when the epitaxial growth layered structure is shaped into a mesa, the cross sectional area of the p type mirror layer becomes smaller so that the resistance of the p type mirror layer increases remarkably due to the adverse effect of a spike at the GaAs/AlAs interface.

Figure 2:
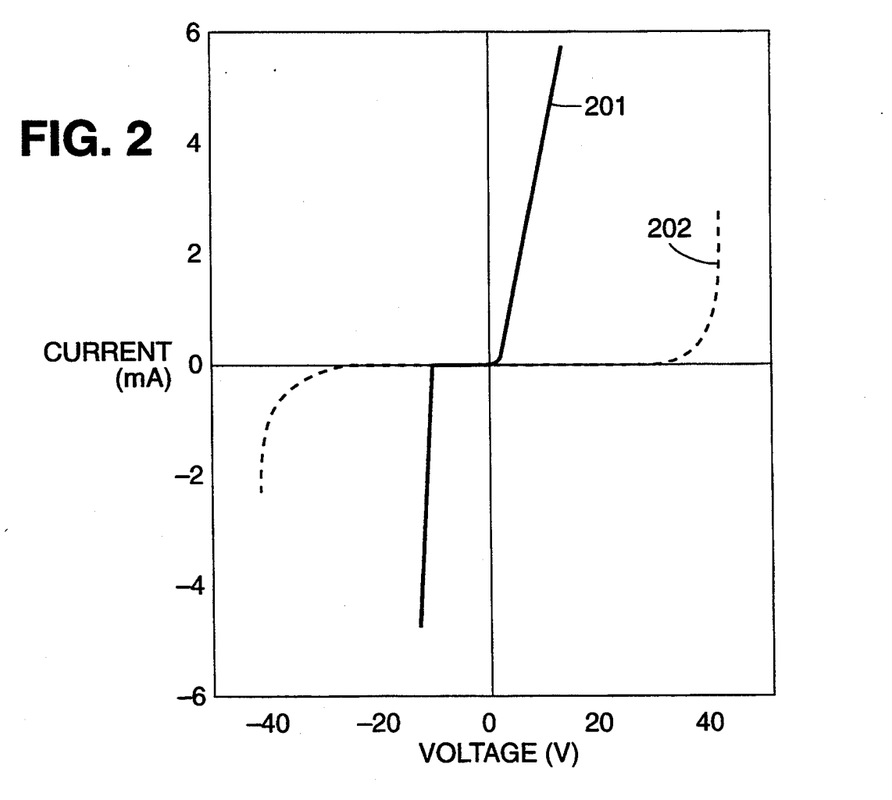
FIG. 2 is a current-voltage characteristic graph of the first embodiment of the present invention.

According to the present invention, the p type mirror layer 104 is disposed on the substrate 105 so that the same is not subject to the etching process in shaping the epitaxial growth structure into a mesa, as seen from FIG. 1. The p type mirror layer 104, while remaining unetched to cover the whole surface of the substrate 105, makes it possible to flow current without the influence of the spike. FIG. 2 illustrates an improved current-voltage characteristic graph of the surface emitting semiconductor laser according to the present invention. The graph 201 represents the I-V characteristic of the semiconductor laser device according to the present invention, whereas another graph 202 represents the counterpart of the conventional laser device. These graphs indicate that the requirement of a voltage applied necessary to flow a threshold value of current for laser oscillation, (i.e., 1 mA) was reduced from 40 V to 4 V.

With the foregoing arrangement, a surface emitting semiconductor laser drivable with a low voltage applied may be realized and implemented. It is, however, to be noted that the present invention is also applicable, as is obvious to those skilled in the art, when a p type substrate is used and an electrode is disposed on the back (bottom) surface of the substrate.

Figure 3:
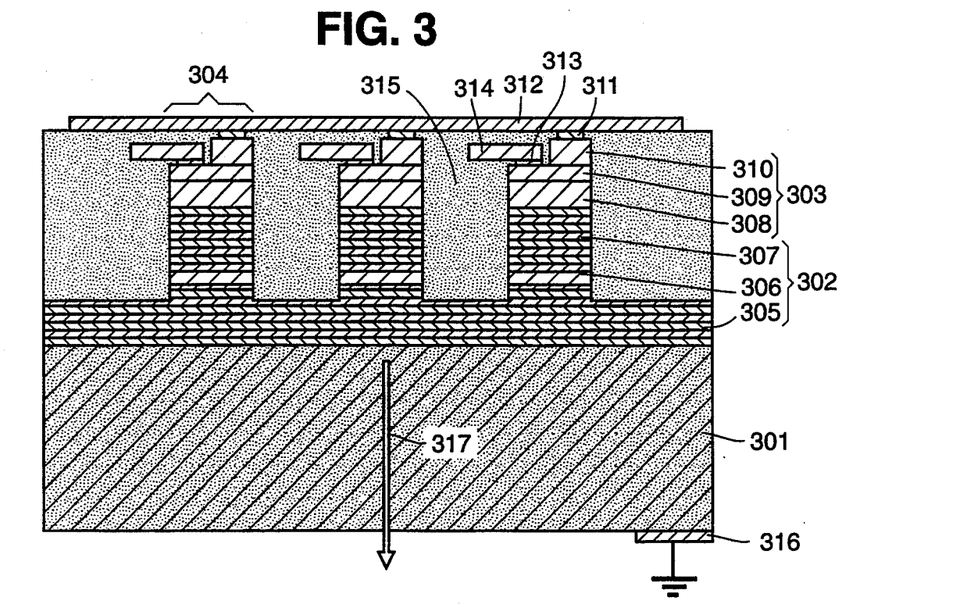
FIG. 3 is a cross sectional view of an optoelectronic integrated circuit device according to a second embodiment of the present invention.

FIG. 3 is a cross sectional view of an optoelectronic integrated circuit device according to a second embodiment of the present invention. There is disposed on a p type GaAs semiconductor substrate 301 a two-dimensional array (i.e., longitudinal and traverse directions of the drawing sheet) of unit cells, each of which comprises a stacked structure of a surface emitting semiconductor laser 302 and a heterojunction bipolar transistor 303. The surface emitting semiconductor laser 302 is each made up by a p type reflector 305 of a stack of alternate p type GaAs and p type AlAs layers, a light emitting section 306 of InGaAs/GaAs strain superlattice as an active layer and an n type reflector 307 of a stack of alternate n type GaAs and n type AlAs layers. The heterojunction bipolar transistors 303, on the other hand, each comprises an n type GaAs collector 308, a p type GaAs base 309, and an n type AlGaAs emitter 310.

Emitter electrodes 311 are disposed on the respective emitters 310 and the emitter electrodes in the unit cells 304 adjacent to each in a lateral direction in the cross sectional view are connected together to a common row wiring 312. Base electrodes 313 are disposed on the respective bases 309 and the base electrodes in the unit cells 304 adjacent to each in a traversing direction in the cross sectional view are connected together to a common column wiring 314. The row and column wirings are isolated with layer isolation layers 315 of, for example, polyamide. The anodes of the surface emitting semiconductor lasers 302 are connected within the crystal structure thereof to the semiconductor substrate 301 which in turn are grounded via a substrate electrode 316. Output light 317 from the surface emitting semiconductor lasers 302 is delivered from the bottom surface of the device after traveling through the semiconductor substrate 301.

Figure 4:
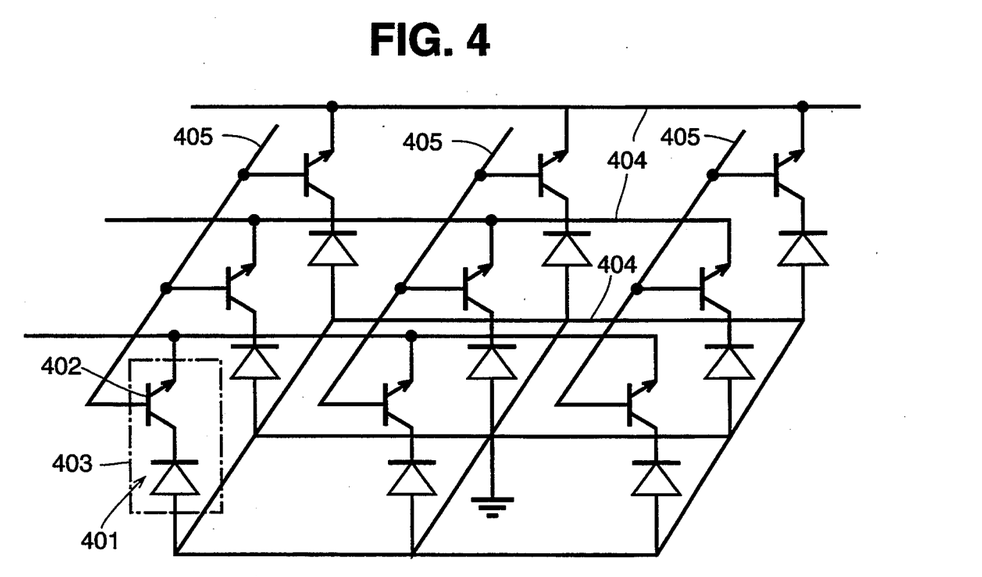
FIG. 4 is an equivalent circuit diagram of the optoelectronic integrated circuit device according to the second embodiment of the present invention.

An equivalent circuit of the above illustrated embodiment is shown in FIG. 4. Unit cells 403 are arranged in a two-dimensional array, each comprising a series circuit of a surface emitting semiconductor laser 401 and a heterojunction bipolar transistor 402, with the anodes of the surface emitting semiconductor lasers 401 being all grounded. Emitters of the heterojunction bipolar transistors 402 are connected to row wirings 404, with the bases thereof being connected to column wirings 405. When a negative bias voltage $-V_{ee}$ is applied to a selected one of the row wirings and a voltage V ($-V_{ee}<-V<0$) to a selected one of the column wirings, the surface emitting semiconductor laser at the crossing thereof is enabled to emit light. Should a ground potential be applied to non-selected ones of the row wirings and $-V_{ee}$ to non-selected ones of the column wirings, the surface emitting semiconductor lasers at crossings other than that of the selected row and column wirings would not be enabled to emit laser light. Moreover, if the voltage V is modulated within the range as defined above, enabling currents for the surface emitting semiconductor lasers will be modulated to provide accordingly modulated output light. Satisfactory modulation of the output light may be expected even with low voltage amplitudes, because input signals are amplified with the heterojunction bipolar transistors.

Although the above illustrated embodiment operates in the foregoing manner, it would also offer structural advantages over the conventional optoelectronic integrated circuit device as shown in FIG. 7. Because the wave reflector of the surface emitting semiconductor laser of the vertical resonance type is generally substantially thick, a deeper isolation groove is needed to isolate adjoining elements by the mesa etching process. It is very difficult to form metallic wirings at the bottom of a deeper groove due to manufacturing limitations, The conventional optoelectronic integrated circuit device, therefore, uses an n+ semiconductor wiring layer as a column wiring. However, the semiconductor wiring layer has the inherent problem that the sheet resistance thereof is higher than that of metallic wirings.

On the contrary, according to the present invention, the column wirings 314 may be formed after the layer isolation material 315 is inserted and buried to fill deep isolation grooves, whereby metallic wirings may be used for matrix or array connection.

Figure 5:
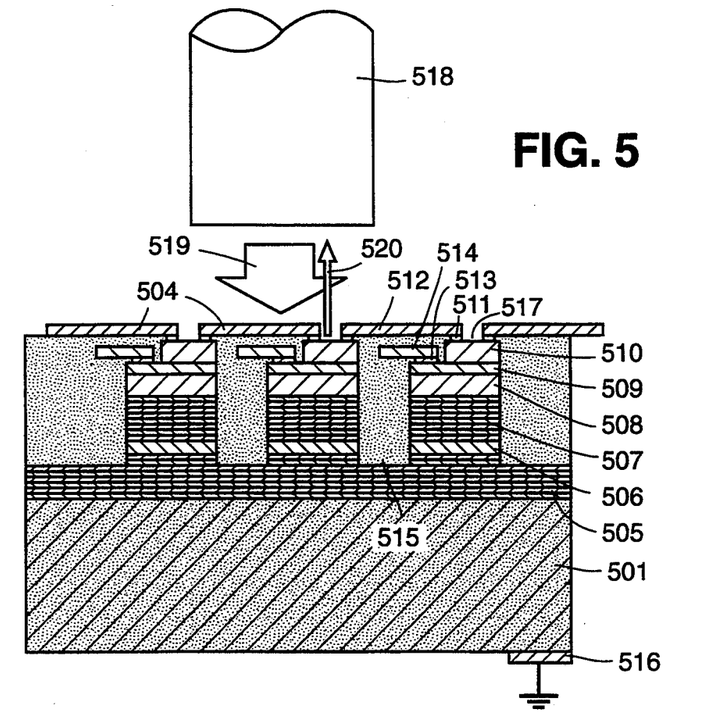
FIG. 5 is a cross sectional view of an optoelectronic integrated circuit device according to a third embodiment of the present invention.

FIG. 5 is a cross sectional view of an optoelectronic integrated circuit device according to a third embodiment of the present invention. Although this embodiment is similar to the second embodiment in terms of basic structure, the differences of the third embodiment over the second lie in that input and output light may be applied to and from a front surface of a semiconductor surface and that one end of an optical transmission path (made of optical fiber in this embodiment) is secured to face a cell array.

There is disposed on a p type GaAs semiconductor substrate 501 a two-dimensional array (i.e., longitudinal and traverse directions of the drawing sheet) of unit cells, each of which comprises a stacked structure of a surface emitting semiconductor laser 502 and a heterojunction bipolar transistor 503. The surface emitting semiconductor laser 502 each comprises a p type reflector 505 of a stack of alternate p type GaAs and p type AlAs layers, a light emitting section 506 of InGaAs/GaAs strain micro-grids as an active layer and an n type reflector 507 of a stack of alternate n type GaAs and n type AlAs layers. The heterojunction bipolar transistor 503, on the other hand, each comprises an n type GaAs collector 508, a p type GaAs base 509, and an n type AlGaAs emitter 510.

Emitter electrodes 511 are disposed on the respective emitters 510 and the emitter electrodes in the unit cells 504 adjacent to each in a lateral direction in the cross sectional view are connected together to a common row wiring 512. Base electrodes 513 are disposed on the respective bases 509 and the base electrodes in the unit cells 504 adjacent to each in a traverse direction in the cross sectional view are connected together to a common column wiring 514. The row and column wirings are isolated with layer isolation layers 515 of, for example, polyamide. The anodes of the surface emitting semiconductor lasers 502 are connected within the crystal structure thereof to the semiconductor substrate 501 which in turn are grounded via a substrate electrode 516.

To permit introduction and delivery of input and output light to and from the front surface of the unit cells, windows 517 are formed in the electrodes and the wirings. The one end of the optical fiber 518 is fixed to face the two-dimensional array of the unit cells 504.

The base-to-emitter junctions of the heterojunction bipolar transistor 503 in the above arrangement may each serve as a light receiving element. The light receiving elements, therefore, may sense address light 519 applied from a remote end of the optical fiber 518 and identify the unit cell to which the address light 519 is applied. It is noted that the address light is of a wavelength shorter than the absorption edge of GaAs. Should a positive voltage be applied to the row wirings 512 and the column wirings 514 be led to a ground level, photo current will flow through the unit cell to which the address light is applied. In other words, if the positive voltage is applied sequentially to the row wirings and the currents flowing through the respective column wirings, then it is possible to identify the location of the unit cell to which the address light is incident. However, in the event that more than one light receiving element senses the address light, the unit cell is selected where the power of the light received (i.e., photo current) assumes the highest. If the surface emitting semiconductor laser 502 included in that unit cell is selectively driven, output light 520 will be delivered. As long as the integration density of the unit cells is sufficiently high and at least one of the surface emitting semiconductor lasers is present within the margin of the scope of the incident light optically coupled with the optical fiber, the positioning of the optical fiber may be achieved by merely satisfying the requirement that the output light from the one end of the optical fiber reaches anywhere in the cell array. The above requirement may be satisfied readily when the optical fiber is of a multi-mode type, because the margin of incidence is larger than 30 μm. Where the optical fiber is of the multi-mode type, a focusing lens may become unnecessary, because the output light of the surface emitting semiconductor lasers generally has a small spreading angle. It is, however, obvious that a lens may be inserted between the surface emitting semiconductor lasers and the optical fiber.

Whereas in the above illustrated embodiments the optical transmission path is made up of the optical fiber, it may be an optical waveguide formed on another substrate. It is also possible that optical axis alignment may be made similarly when a path of light beam traveling in the air or a space is considered as a virtual optical transmission path.

ADVANTAGES OF THE PRESENT INVENTION

According to the present invention, the p type mirror layer is disposed on the substrate so that the p type mirror layer is not subjected to the mesa etching process. With this arrangement, the effect of the spike may be minimized or eliminated which is developed at the valence band at the GaAs/AlAs heterojunction interface. This makes it possible to develop and implement a low driving voltage surface emitting semiconductor laser.

The present invention also realizes the implementations of optoelectronic integrated circuit devices where selectively drivable and modulatable surface emitting semiconductor lasers are arranged in a two-dimensional array. Because a driving circuit for the surface emitting semiconductor lasers is integrated on the optoelectronic integrated circuit device according to the present invention, the surface emitting semiconductor lasers may be modulated with input signals of small voltage amplitudes from outside.

Moreover, the present invention provides optoelectronic integrated circuit devices including semiconductor lasers which may be optically coupled readily with the optical transmission path.

The foregoing description and the drawings are illustrative and are not to be taken as limiting. Still other variations and modifications are possible without departing from the spirit and scope of the present invention.

What is claimed is:
1. An optical semiconductor device comprising:
    a substrate;
    a vertical resonance type laser light emitting area disposed on said substrate, said vertical resonance type laser light emitting area comprising a stack of a first conductivity type semiconductor mirror layer, an active layer, and a second conductivity type semiconductor mirror layer;
    a mesa structure in said vertical resonance type laser light emitting area, said mesa structure comprising said second conductivity type semiconductor mirror layer and said active layer, whereby a current path in said first conductivity type semiconductor mirror layer not present in said mesa structure is not narrowed, thereby lessening the effect of a spike at a valence band at said first conductivity type semiconductor mirror layer.

2. An optical III-V compound semiconductor device comprising:
    a substrate;
    a vertical resonance type III-V compound laser light emitting area disposed on said substrate, said vertical resonance type III-V compound laser light emitting area comprising a stack of a first conductivity type III-V semiconductor mirror layer, a III-V compound active layer, and a second conductivity type III-V compound semiconductor mirror layer;
    a mesa structure in said vertical resonance type laser light emitting area, said mesa structure comprising said second conductivity type III-V compound semiconductor mirror layer and said III-V compound semiconductor active layer, whereby said first conductivity type III-V compound semiconductor mirror layer is not present in said mesa structure and a current path in said first conductivity type III-V compound semiconductor mirror layer is not narrowed, thereby lessening the effect of a spike at a valence band at said first conductivity type III-V compound semiconductor mirror layer.

3. An optical semiconductor device according to claim 1 wherein said vertical resonance type laser light emitting area comprises a p type semiconductor mirror layer, an active layer and an n type semiconductor mirror layer; and
    wherein said mesa structure comprises said n type semiconductor mirror layer and said active layer, whereby a current path in said p type semiconductor mirror layer not present in said mesa structure is not narrowed, thereby lessening the effect of a spike at a valence band at said p type semiconductor mirror layer.

4. An optical III-V compound semiconductor device according to claim 2 wherein said vertical resonance III-V compound laser light emitting area comprises a stack of a p type III-V semiconductor mirror layer, a III-V compound active layer, and an n type III-V compound semiconductor mirror layer on said substrate, with said p type III-V semiconductor mirror layer being in contact with said substrate; and wherein
    said mesa structure comprises said n type III-V compound semiconductor mirror layer and said III-V compound active layer, whereby said p type III-V compound semiconductor mirror layer is not present in said mesa structure and a current path in said p type III-V compound semiconductor mirror layer is not narrowed, thereby lessening the effect of a spike at a valence band at said p type III-V semiconductor mirror layer.

5. An optical III-V compound semiconductor device according to claim 2 wherein said vertical resonance type III-V compound laser light emitting area comprises a stack of a p type GaAs/AlAs semiconductor mirror layer, a III-V compound active layer, and an n type GaAs/AlAs semiconductor mirror layer on said substrate, with said P type GaAs/AlAs semiconductor mirror layer being in contact with said substrate; and wherein
    said mesa structure comprises said n type GaAs/AlAs semiconductor mirror layer and said III-V compound active layer, whereby said p type GaAs/AlAs semiconductor mirror layer is not present in said mesa structure and a current path in said p type GaAs/AlAs semiconductor mirror layer is not narrowed, thereby lessening the effect of a spike at a valence band at said p type GaAs/AlAs semiconductor mirror layer.

6. An optical III-V compound semiconductor device according to claim 5 wherein said p type GaAs/AlAs semiconductor mirror layer comprises a stack of alternative p type GaAs and p type AlAs layers and said n type GaAs/AlAs semiconductor mirror layer comprise a stack of alternative n type GaAs and n type AlAs layers.

7. An optical III-V compound semiconductor device according to claim 5 wherein said active layer in the laser light emitting area comprises InGaAs/GaAs material.

8. An optical III-V compound semiconductor device according to claim 4 further comprising:
   a first electrode disposed in contact with said p type III-V compound semiconductor mirror layer;
   a second electrode disposed in contact with said n type III-V compound semiconductor mirror layer;
   means for applying a voltage between the first and second electrodes to enable the active layer to emit light and cause resonance of the emitted light within a resonance defined by the first and second electrodes.

9. An optical III-V compound semiconductor device according to claim 5 wherein the cross sectional area of the p type GaAs/AlAs semiconductor mirror layer not present in said mesa structure is larger than that of the n type GaAs/AlAs semiconductor mirror layer present in said mesa structure.

10. An optical III-V compound semiconductor device according to claim 5 wherein the GaAs substrate is of p type conductivity and an electrode is disposed on a back of the p type GaAs substrate.

11. An optical semiconductor device as claimed in claim 3 wherein said optical semiconductor device is formed in a two-dimensional array including a plurality of said vertical resonance type laser light emitting areas with said mesa structure.

12. An optical semiconductor device comprising:
   a GaAs substrate;
   a vertical resonance type laser element of an exitaxial growth layered structure disposed on said GaAs substrate, said epitaxial growth layered structure comprising a stack of a p type GaAs/AlAs semiconductor mirror layer, an active layer, and an n type GaAs/AlAs semiconductor mirror layer arranged on said GaAs substrate;
   said epitaxial growth layered structure being shaped into a mesa by etching said n type mirror layer and said active layer in said epitaxial growth layered structure;
   an electrode disposed on said n type mirror layer; and
   an electrode disposed on said p type mirror layer exposed through the etching.

* * * * *